United States Patent
Anella et al.

(10) Patent No.: US 8,202,789 B2
(45) Date of Patent: Jun. 19, 2012

(54) IMPLANTING A SOLAR CELL SUBSTRATE USING A MASK

(75) Inventors: Steven M. Anella, West Newbury, MA (US); William Weaver, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 410 days.

(21) Appl. No.: 12/555,005

(22) Filed: Sep. 8, 2009

(65) Prior Publication Data
US 2010/0062589 A1    Mar. 11, 2010

Related U.S. Application Data

(60) Provisional application No. 61/095,671, filed on Sep. 10, 2008.

(51) Int. Cl.
*H01L 21/425* (2006.01)
(52) U.S. Cl. ........ 438/514; 438/519; 438/527; 438/531; 438/551; 257/E21.346
(58) Field of Classification Search ............... 438/514, 438/519, 527, 531, 551; 257/E21.346
See application file for complete search history.

(56) References Cited

U.S. PATENT DOCUMENTS

| | | | |
|---|---|---|---|
| 4,086,102 A | 4/1978 | King | |
| 4,140,610 A | 2/1979 | Morimoto | |
| 4,667,060 A | 5/1987 | Spitzer | |
| 6,184,111 B1 | 2/2001 | Henley et al. | |
| 2006/0011582 A1 | 1/2006 | Savas | |
| 2009/0068783 A1 | 3/2009 | Borden | |
| 2009/0158236 A1 | 6/2009 | Shibata | |
| 2009/0227062 A1 | 9/2009 | Sullivan et al. | |
| 2010/0062589 A1* | 3/2010 | Anella et al. ................ | 438/527 |

FOREIGN PATENT DOCUMENTS

| | | |
|---|---|---|
| JP | H06-124673 | 5/1994 |
| JP | H09-259779 | 10/1997 |
| JP | 2007-220707 | 8/2007 |

OTHER PUBLICATIONS

E. Van Kerschaver & G. Beaucarne, Back-Contact Solar Cells: A Review, Progress in PV: Research & Applications, Dec. 20, 2005, pp. 107-123, vol. 14, John Wiley & Sons, Ltd.
P. Verlinden et al., Multilevel Metallization for Large Area Point Contact Solar Cells, PV Spec. Conf., 1988, vol. 1, pp. 532-537, IEEE.
M.D. Lammert & R.J. Schwartz, The Interdigitated Back Contact Solar Cell: A Silicon Solar Cell for Use in Concentrated Sunlight, IEEE Trans. on Electron Devices, Apr. 1997, vol. ED-24, No. 4, pp. 337-342, IEEE.

* cited by examiner

*Primary Examiner* — Jack Chen

(57) ABSTRACT

Various masks for use with ion implantation equipment are disclosed. In one embodiment, the masks are formed by assembling a collection of segments and spacers to create a mask having the desired configuration. This collection of parts is held together with a carrier or frame. In another embodiment, a panel is formed by machining open-ended slots into a substrate, so as to form a comb-shaped device. Two such panels may be connected together to form a mask. In other embodiments, the panels may be used sequentially in an ion implantation process to create interdigitated back contacts. In another embodiment, multiple masks are overlaid so as to create implant patterns that cannot be created effectively using a single mask.

4 Claims, 11 Drawing Sheets

Mask #1

Mask #2

US 8,202,789 B2

IMPLANTING A SOLAR CELL SUBSTRATE USING A MASK

This application claims priority of U.S. Provisional Patent Application No. 61/095,671, filed Sep. 10, 2008, the disclosure of which is herein incorporated by reference in its entirety.

FIELD

This invention relates to implanting solar cell substrates, and, more particularly, to implanting a solar cell substrates using a mask.

BACKGROUND

Ion implantation is a standard technique for introducing conductivity-altering impurities into semiconductor substrates. A desired impurity material is ionized in an ion source, the ions are accelerated to form an ion beam of prescribed energy, and the ion beam is directed at the surface of the substrate. The energetic ions in the beam penetrate into the bulk of the semiconductor material and are embedded into the crystalline lattice of the semiconductor material to form a region of desired conductivity.

Solar cells are only one example of a device that uses silicon substrates, but these solar cells are becoming more important globally. Any reduced cost to the manufacturing or production of high-performance solar cells or any efficiency improvement to high-performance solar cells would have a positive impact on the implementation of solar cells worldwide. This will enable the wider availability of this clean energy technology.

In the past, solar cells have been doped using a dopant-containing glass or a paste that is heated to diffuse dopants into the solar cell. This does not allow precise doping of the various regions of the solar cell and, if voids, air bubbles, or contaminants are present, nonuniform doping may occur. Solar cells could benefit from ion implantation because ion implantation allows precise doping of the solar cell. Ion implantation of solar cells, however, may require a certain pattern of dopants or that only certain regions of the solar cell substrate are implanted with ions. Previously, implantation of only certain regions of a substrate has been accomplished using photoresist and ion implantation. Use of photoresist, however, would add an extra cost to solar cell production because extra process steps are involved. Accordingly, there is a need in the art for improved implanting of solar cell substrates and, more particularly, improved implanting of solar cell substrates using a mask.

SUMMARY

Various masks for use with ion implantation equipment are disclosed. In one embodiment, the masks are formed by assembling a collection of segments and spacers to create a mask having the desired configuration. This collection of parts is held together with a carrier or frame. In another embodiment, a panel is formed by machining open-ended slots into a substrate, so as to form a comb-shaped device. Two such panels may be connected together to form a mask. In other embodiments, the panels may be used sequentially in an ion implantation process to create interdigitated back contacts. In another embodiment, multiple masks are overlaid so as to create implant patterns that cannot be created effectively using a single mask.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and process described herein may be performed by, for example, a beam-line ion implanter. Other plasma processing equipment or equipment that generates ions also may be used. While a silicon solar cell is specifically disclosed, other solar cell substrate materials also may benefit from embodiments of the process described herein. Furthermore, while a solar cell is discussed, this process also may be applied to semiconductor wafer fabrication or other substrates.

Figure 1:
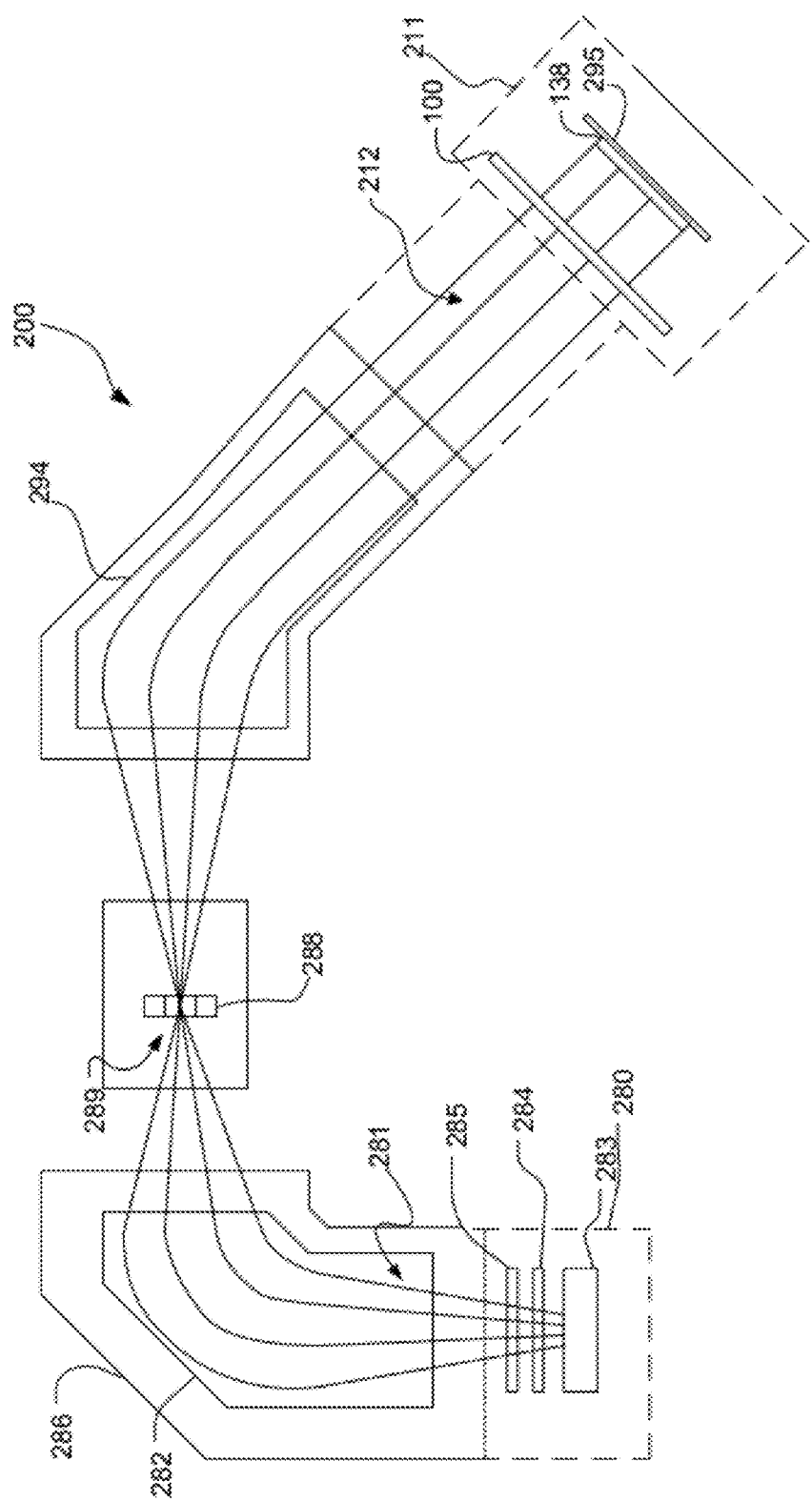
FIG. 1 is a block diagram of a beam-line ion implanter 200.

Turning to FIG. 1, a block diagram of a beam-line ion implanter 200 is illustrated. Those skilled in the art will recognize that the beam-line ion implanter 200 is only one of many examples of beam-line ion implanters that can provide ions for doping a selected material. Thus, this process is not limited solely to the beam-line ion implanter 200 of FIG. 1.

In general, the beam-line ion implanter 200 includes an ion source 280 to generate ions that form an ion beam 281. The ion source 280 may include an ion chamber 283 and a gas box containing a gas to be ionized or a vaporizer to vaporize a solid to form a gas. The gas is supplied to the ion chamber 283 where the gas is ionized. This gas may be or may include or contain, in some embodiments, hydrogen, helium, other rare gases, oxygen, nitrogen, arsenic, boron, phosphorus, antimony, gallium, indium, carborane $C_2B_{10}H_{12}$, or another large molecular compound. The ions thus formed are extracted from the ion chamber 283 to form the ion beam 281. The ion beam 281 is directed between the poles of resolving magnet 282. A power supply is connected to an extraction electrode of the ion source 280 and provides an adjustable voltage.

The ion beam 281 passes through a suppression electrode 284 and ground electrode 285 to mass analyzer 286. Mass analyzer 286 includes resolving magnet 282 and masking electrode 288 having resolving aperture 289. Resolving magnet 282 deflects ions in the ion beam 281 such that ions of a desired ion species pass through the resolving aperture 289. Undesired ion species do not pass through the resolving aperture 289, but are blocked by the masking electrode 288.

Ions of the desired ion species pass through the resolving aperture 289 to the angle corrector magnet 294. Angle corrector magnet 294 deflects ions of the desired ion species and converts the ion beam from a diverging ion beam to ribbon ion beam 212, which has substantially parallel ion trajectories. The beam-line ion implanter 200 may further include acceleration or deceleration units in some embodiments.

An end station 211 supports one or more substrates, such as substrate 138, in the path of ribbon ion beam 212 such that ions of the desired species are implanted into substrate 138.

The substrate 138 may be, for example, a silicon wafer or a solar cell. The end station 211 may include a platen 295 to support the substrate 138. The end station 211 also may include a scanner (not shown) for moving the substrate 138 perpendicular to the long dimension of the ribbon ion beam 212 cross-section, thereby distributing ions over the entire surface of the substrate 138. Although the ribbon ion beam 212 is illustrated, other embodiments may provide a spot beam.

In some embodiments, a mask 100 may be used to block a portion of the ion beam from striking a portion of the substrate 138. The mask 100 may be located near the substrate, preferably with some gap between it and the substrate 138. Such a mask 100 allows for the selective implantation of ions into the substrate 138.

The ion implanter may include additional components known to those skilled in the art. For example, the end station 211 typically includes automated substrate handling equipment for introducing substrates into the beam-line ion implanter 200 and for removing substrates after ion implantation. The end station 211 also may include a dose measuring system, an electron flood gun, or other known components. It will be understood to those skilled in the art that the entire path traversed by the ion beam is evacuated during ion implantation. The beam-line ion implanter 200 may incorporate hot or cold implantation of ions in some embodiments.

Figure 2:
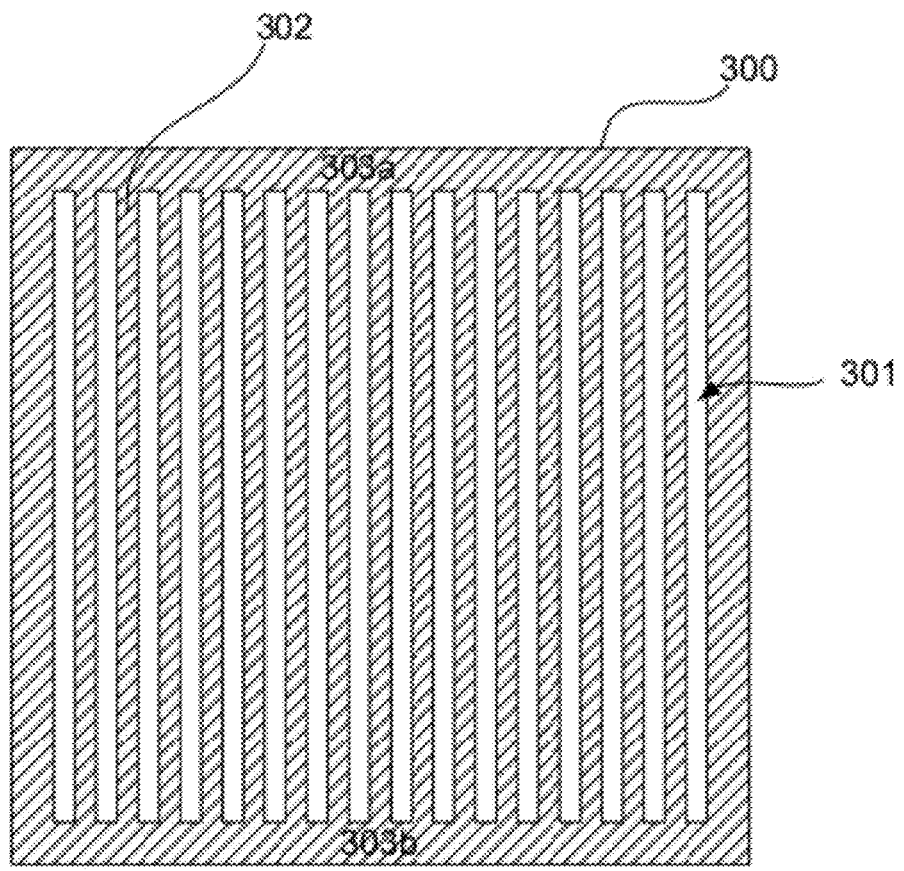
FIG. 2 is a first embodiment of a mask.

FIG. 2 is a first embodiment of a mask. The mask 300 in this embodiment is created from a single substrate. The mask 300 may be fabricated of graphite, carbon, silicon, quartz, or another material that is configured to operate in an ion beam or vacuum environment. The mask 300 defines a pattern of openings 301. Ions are implanted through the openings 301 in the mask 300. The openings 301 may correspond with the desired implant region on the solar cell substrate. The openings 301 may be formed by drilling, etching, or other machining, for example. In mask 300, the openings 301 are separated by cross members 302. The cross members 302 attach to bases 303a,303b on opposite sides of the mask 300. The widths of the openings 301 and the cross members 302 may be common, or may be of different dimensions, depending on the required pattern. In some embodiments, the cross members 302 and the openings 301 may be between one hundred microns and a 3-5 millimeters, although other dimensions are possible.

Figure 6:
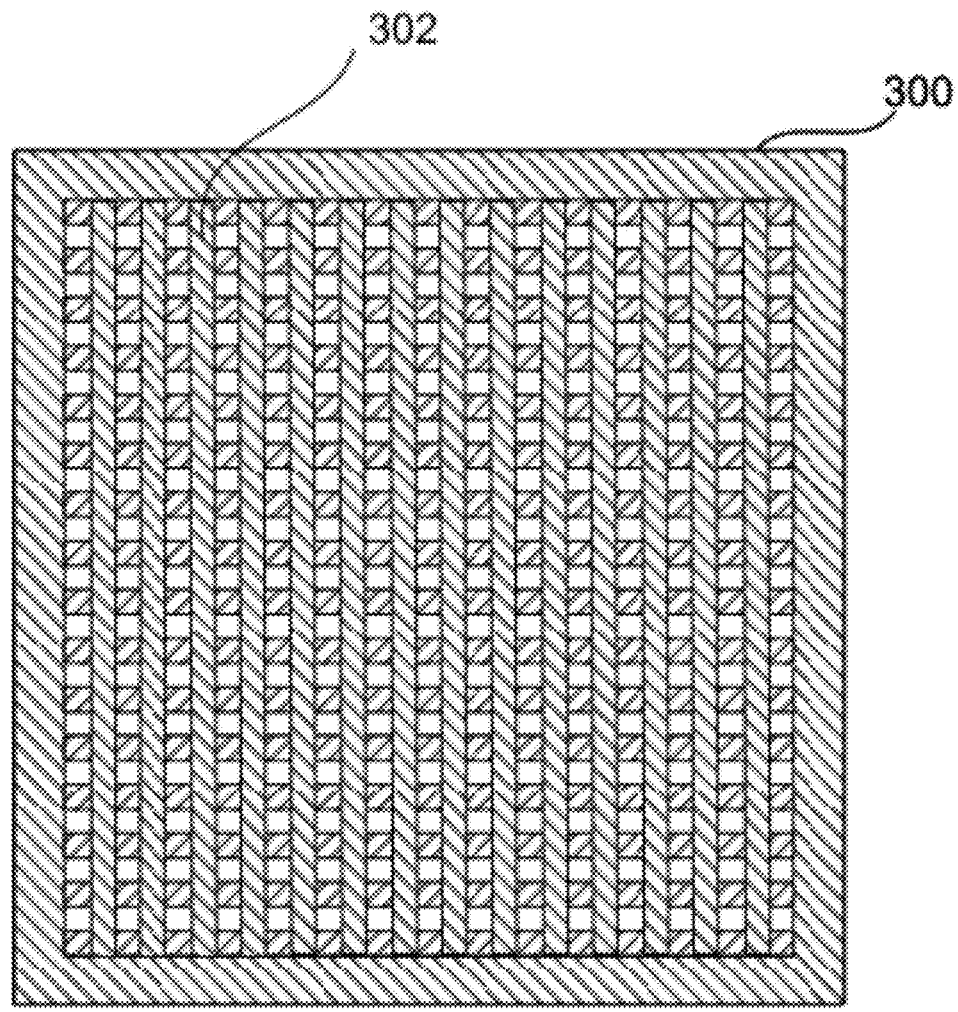
FIG. 6 is a first embodiment utilizing two masks.

In some embodiments, a plurality of masks 300 can be used simultaneously to create additional implant patterns. For example, two masks 300 of the type shown in FIG. 2 may be overlaid. The first mask is oriented as shown in FIG. 2, while the second mask is positioned in an orthogonal orientation to the first mask. In this embodiment, the cross members 302 overlap. The resulting mask, shown in FIG. 6, allows a checkerboard type pattern to be implanted on the substrate 138. This checkerboard type pattern may be less expensive and easier to manufacture than a single mask having this pattern.

Figure 7:
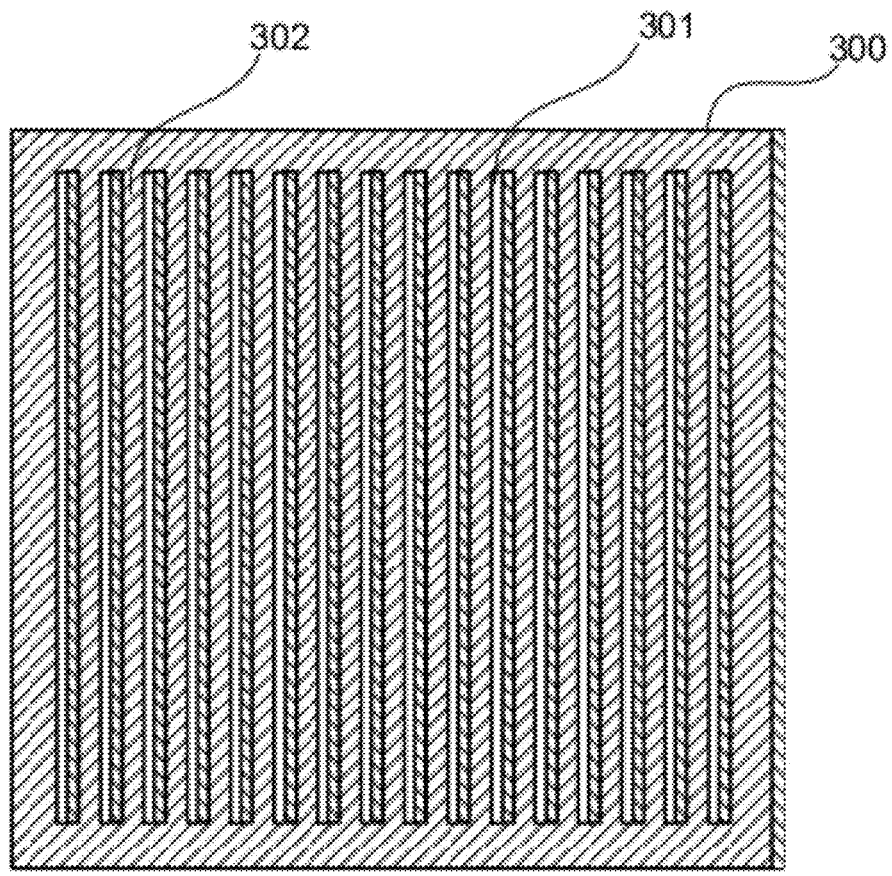
FIG. 7 is a second embodiment utilizing two masks.
Figure 7:
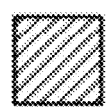
Figure 7:
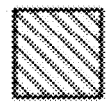

In another embodiment, two masks, such as that shown in FIG. 2, may be oriented in the same direction. FIG. 7 shows two overlapping masks, where one is represented by a crosshatch in one direction, while the second is represented by a crosshatch in a second direction. When the two masks are moved relative to one another, such as in the left or right direction (as seen in FIG. 7), the cross members 302 become offset from one another, thereby reducing the effective size of the openings 301. This allows the creation of implant masks that may have openings 301 that are narrower than are possible with a single mask 300. For example, the machined openings may be between 300-500 microns. By sliding the masks relative to one another, the effective size of the openings can be as large as the machined openings or can be reduced to zero. FIG. 7 shows an embodiment where the opening 301 and the cross member 302 are the same thickness. Other patterns can be created by using openings 301 and cross members 302 having different dimensions.

By offsetting the masks as described above, it is possible to reduce the effective opening through which ions may pass. However, this necessarily increases the spacing between the openings. If necessary, a multiple pass implant may be done, where the two masks are used to produce a set of very thin implant regions in the substrate. The two masks are then moved relatively to their former position so as to allow the creation of additional implant regions between those created by the first pass.

Figure 3:
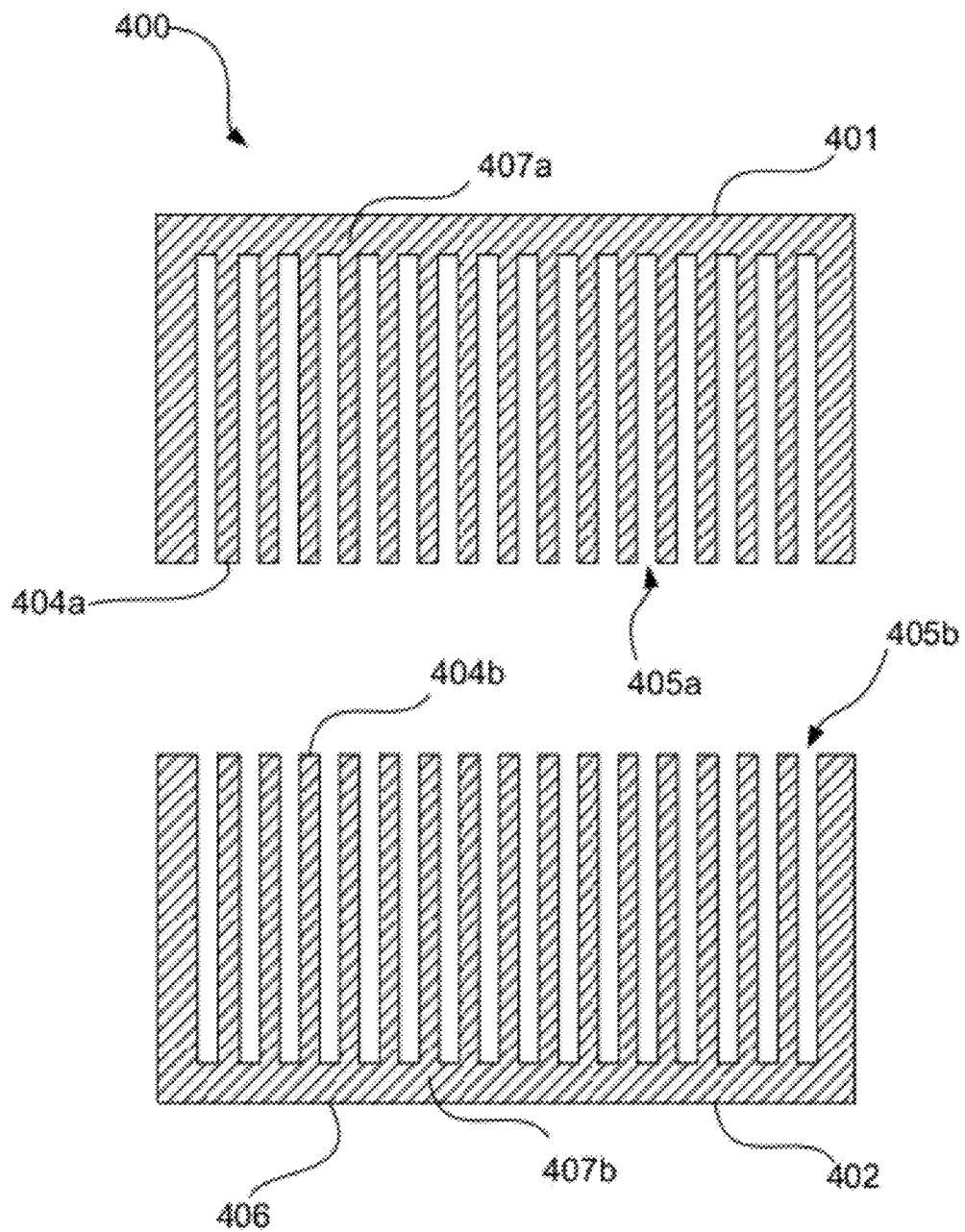
FIG. 3 is a second embodiment of a mask.

FIG. 3 is a second embodiment of a mask. The mask 400 is made up of two panels 401, 402. The mask 400 may be fabricated of graphite, carbon, silicon, quartz, or another material that is configured to operate in an ion beam or vacuum environment. Each panel 401, 402 has multiple strips 404a, 404b, respectively. Each pair of strips forms at least part of an open-ended slot 405a, 405b.

The panel 401, 402 may be created as follows. The slots 405a, 405b may be formed by drilling, etching, or other machining, for example. The height of the slots 405a, 405b is less then the overall height of the panel 401, 402, thereby leaving one un-machined base 407a, 407b. The un-machined material between the slots 405a, 405b form the strips 404a, 404b. These strips 404a, 404b all attach to the un-machined bases 407a, 407b of the panel, thereby creating a comb-like shaped panel. In some embodiments, the slots may be between 300-500 microns in width, while the strips can vary in accordance with design parameters. In one embodiment, strips of 2 millimeters may be used. However, other dimensions are possible and within the scope of the disclosure.

Figure 8A:
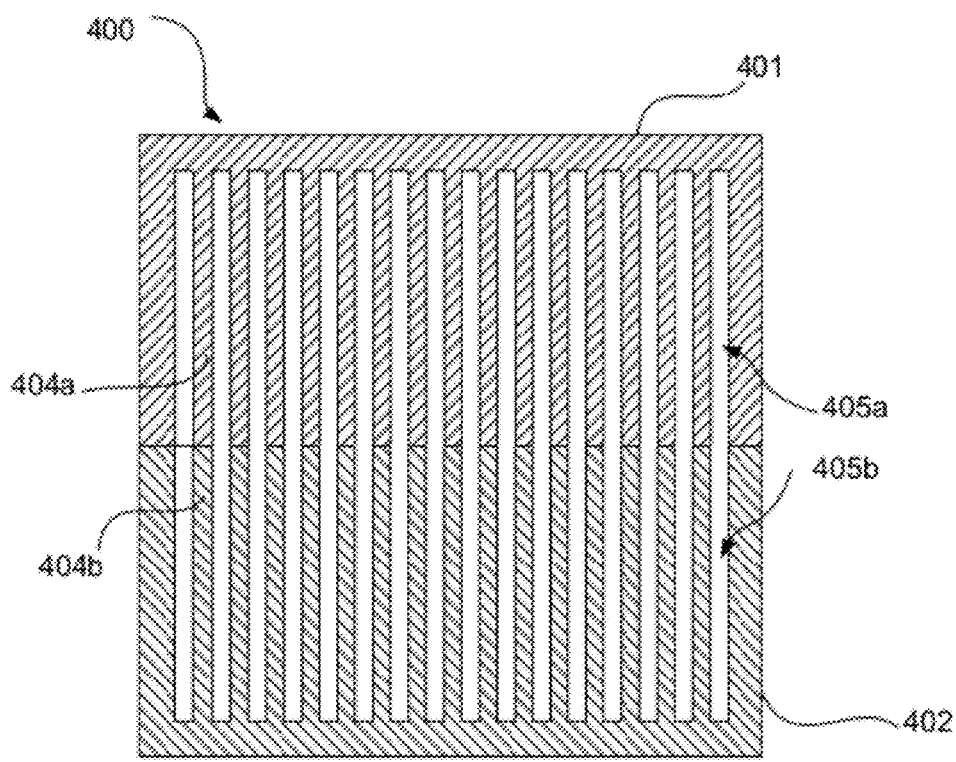
FIG. 8*a* shows a first embodiment of the mask of FIG. 3.

To form the mask 400, the two panels 401, 402 may be aligned so that the distal end of each strip 404a contacts the distal end of a corresponding strip 404b. This embodiment is shown in FIG. 8a. The two panels 401, 402 may disposed on each other by mechanical fastening or may be surrounded by a frame or carrier that hold the panels 401, 402 in place. The frame or carrier may be fabricated of the same material as the mask 400 or may be fabricated of a different material than the mask 400. The frame or carrier may not be in the path of the ion beam in one instance, so fabricating the frame or carrier of a material configured to operate in an ion beam environment may not be necessary. In yet another embodiment, the two panels 401, 402 are disposed on each other using another substrate that is referenced to the frame or carrier by a mechanical means, such as an alignment pin.

In one embodiment, the individual slots 405a, 405b are machined to an alignment feature that can be referenced by an external substrate, such as a solar cell substrate. This alignment feature may be a reference pin, an alignment pin, a flat edge, a protrusion, a hole, or a slot, for example. In this particular embodiment, the alignment feature may be the surface 406.

Figure 8B:
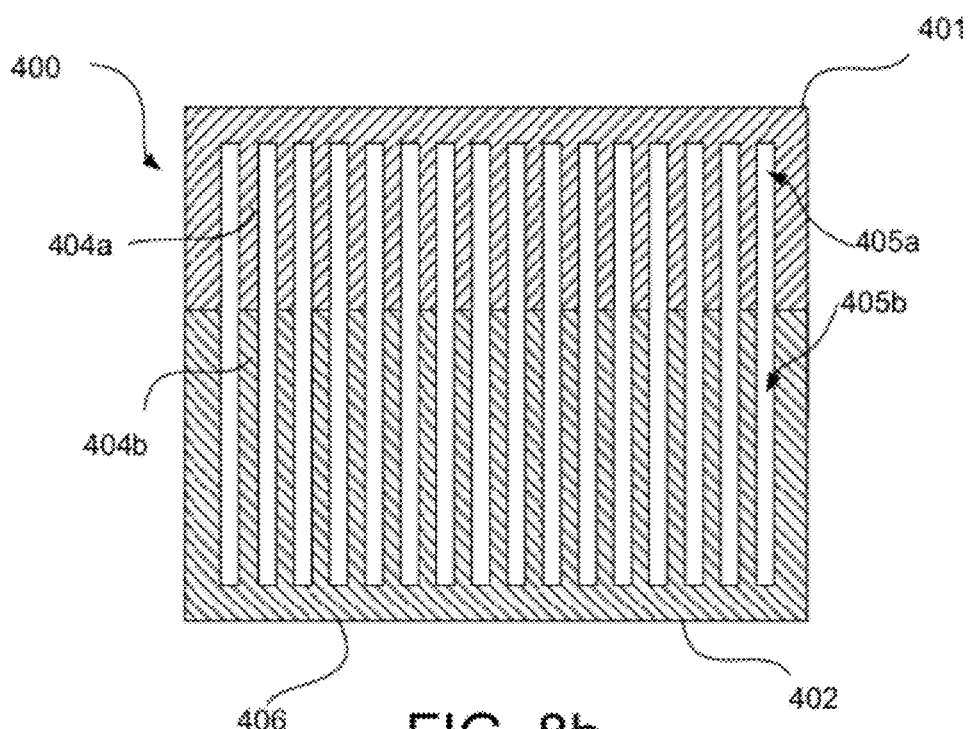
FIG. 8*b* shows a second embodiment of the mask of FIG. 3.

In another embodiment, the two panels are overlaid such that a portion of strips 404a overlap strips 404b. This allows the creation of an implant pattern having openings of various heights if necessary. FIG. 8a shows a first embodiment where strips 404a, 404b touch, but do not overlap. FIG. 8b shows a second embodiment, where the strips are overlapping, thereby reducing the effective height of the slots 405a, 405b with respect to FIG. 8A.

In another embodiment, the two panels are overlaid in the manner shown in FIG. 7. By offsetting the panels 401, 402 relative to one another, the width of the openings 405a, 405b can be reduced. Furthermore, the techniques of FIGS. 7 and 8b can be combined to vary both the height and the width of the openings, as required. The carrier or frame may be used to hold the panels 401, 402 in place.

Figure 4:
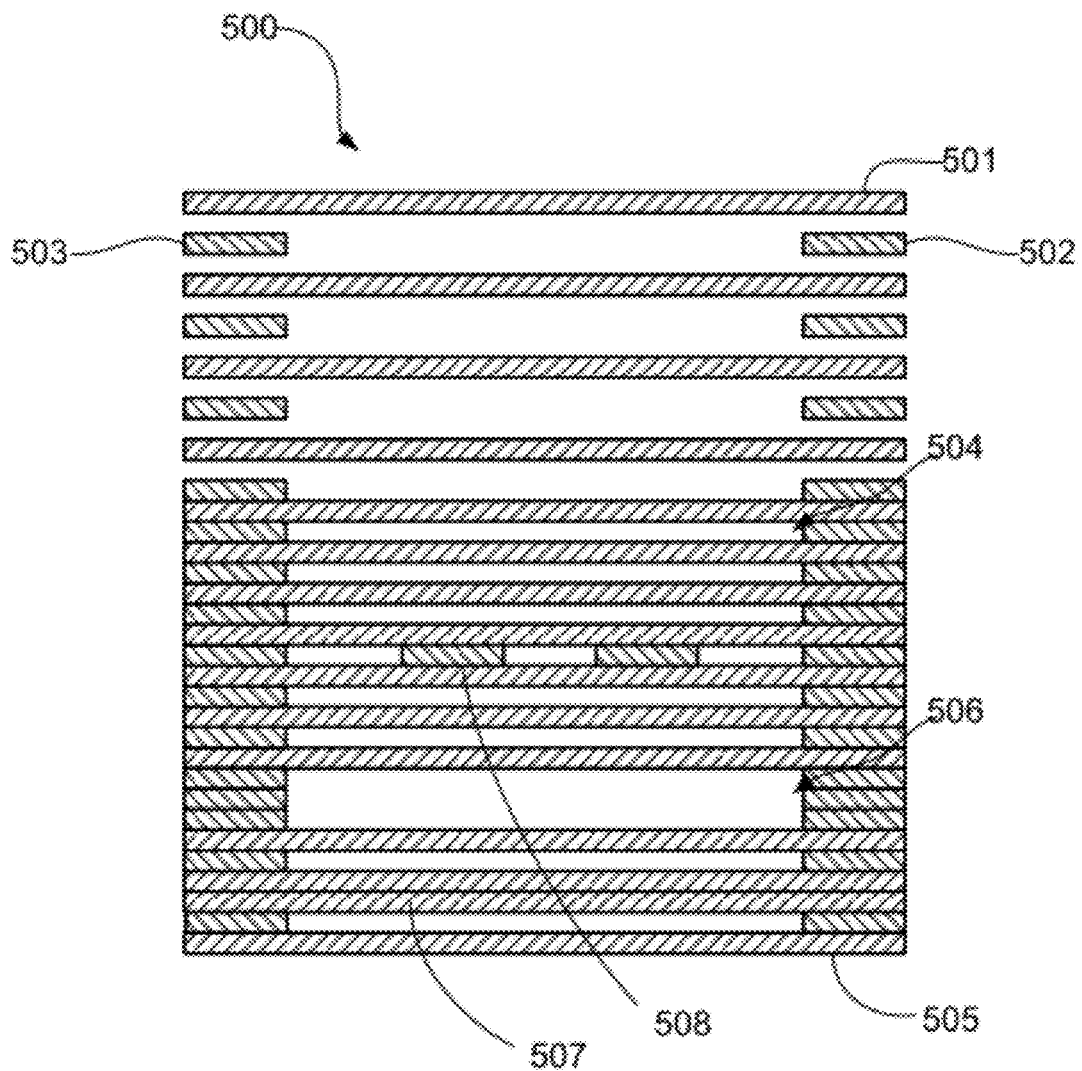
FIG. 4 is a third embodiment of a mask.

FIG. 4 is a third embodiment of a mask. The mask 500 is made up of stacked segments 501 separated by spacers 502, 503. The segments 501 and spacers 502, 503 may be fabricated of graphite, carbon, silicon, quartz, or another material that is configured to operate in an ion beam or vacuum environment. Segments 501 and spacers 502, 503 may have known dimensions. Use of a plurality of segments 501 and spacers 502, 503 allows a mask 500 to be built with multiple openings 504.

In one particular embodiment, a frame or carrier surrounds the segments 501 and spacers 502, 503 to form the mask 500 and hold it in place. The frame or carrier may be fabricated of the same material as the segments 501 and spacers 502, 503 or may be fabricated of a different material than the segments 501 or spacers 502, 503. The frame or carrier may not be in the path of the ion beam in one instance, so fabricating the frame or carrier of a material configured to operate in an ion beam environment may not be necessary. Clamping the frame or carrier or clamping the segments 501 or spacers 502, 503 may, in one instance, hold the mask 500 in place.

In some embodiments, the frame or carrier may be rectangular and form a border around the segments 501 and spacers 502, 503. In other embodiments, clamps, such as C shaped clamps may be used to hold the opposing ends together.

In some embodiments, spacers 502, 503 may be stacked together to form a larger opening 506. In some embodiments, multiple segments 501 are stacked together to form larger mask area 507. While the segments 501 and spacers 502, 503 have uniform dimensions in FIG. 4, in another embodiment, the segments 501 and spacers 502, 503 may have non-uniform dimensions to allow a certain pattern of openings 504 to be formed. For example, spacers 502, 503 of different widths can be used to create rectangular openings 504 of various widths. In another embodiment, different sized spacers 502, 503 may be used to form a single irregular shaped (for example, trapezoidal) opening. The length of the segments 501 may define one dimension of the mask, while the second dimension of the mask may be defined by the sum of the widths of the stacked segments 501 and spacers 502, 503, which make up that dimension. In some embodiments, the segments may be between 1 and 2 millimeters in width, while the spacers may be between 300-500 microns in width. Again, other dimensions are possible and within the scope of the disclosure.

In another embodiment, one or more additional spacers 508 may be placed between spacers 502, 503. This further restricts the opening through which ions can pass.

While the length of the segments 501 may define one dimension of the mask, the length of the spacers 502, 503 is less than the length of the segments, so as to create openings in the mask. As described above, the heights of the various segments 501 and spacers 502, 503 may be varied as desired.

The edge of the segments 501 may be aligned to the frame or carrier to provide a feature that can be referenced by an external substrate, such as a solar cell substrate. This alignment feature may be a flat edge, a protrusion, a hole, or a slot, for example. In this particular embodiment, the alignment feature may be the surface 505.

Figure 5:
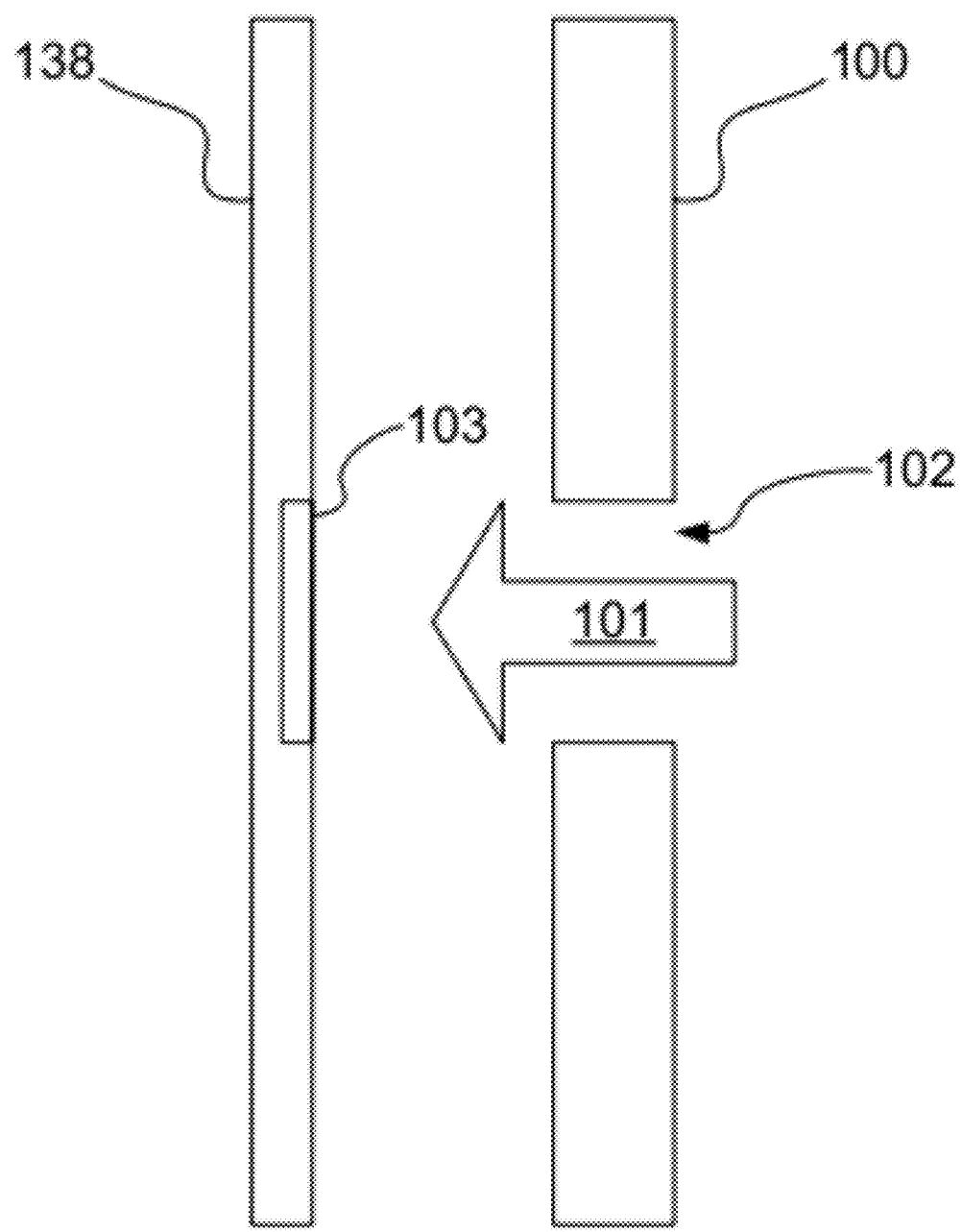
FIG. 5 is an embodiment of implanting through a mask.

FIG. 5 is an embodiment of implanting through a mask. The substrate 138 is positioned downstream of the mask 100. The mask 100 may correspond to the masks illustrated in FIGS. 2-4. This mask 100 has at least one opening 102. While one opening 102 is illustrated, other embodiments have multiple openings in the mask 100. The ions 101 are implanted into the substrate 138 through the opening 102 to form implanted region 103. The ions 101 may, in one particular embodiment, correspond to the ribbon ion beam 212 of FIG. 1. Use of the mask 100 may allow a pattern to be implanted in the implanted region 103 of the substrate 138, which may be a solar cell in one particular embodiment. In one embodiment, implanting through the mask 100 allows formation of a desired implant pattern in the solar cell. This pattern may be for contacts on the solar cell, for example.

Figure 9A:
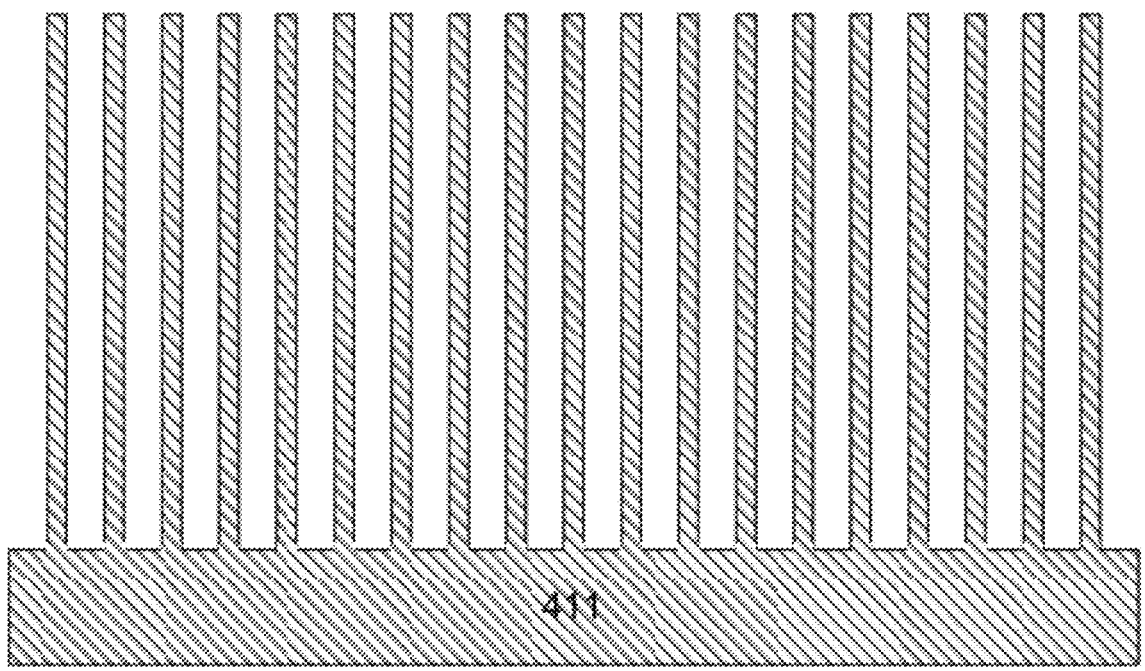
FIGS. 9*a-c* show various implant regions created on a substrate by using the mask of FIG. 3.
Figure 9B:
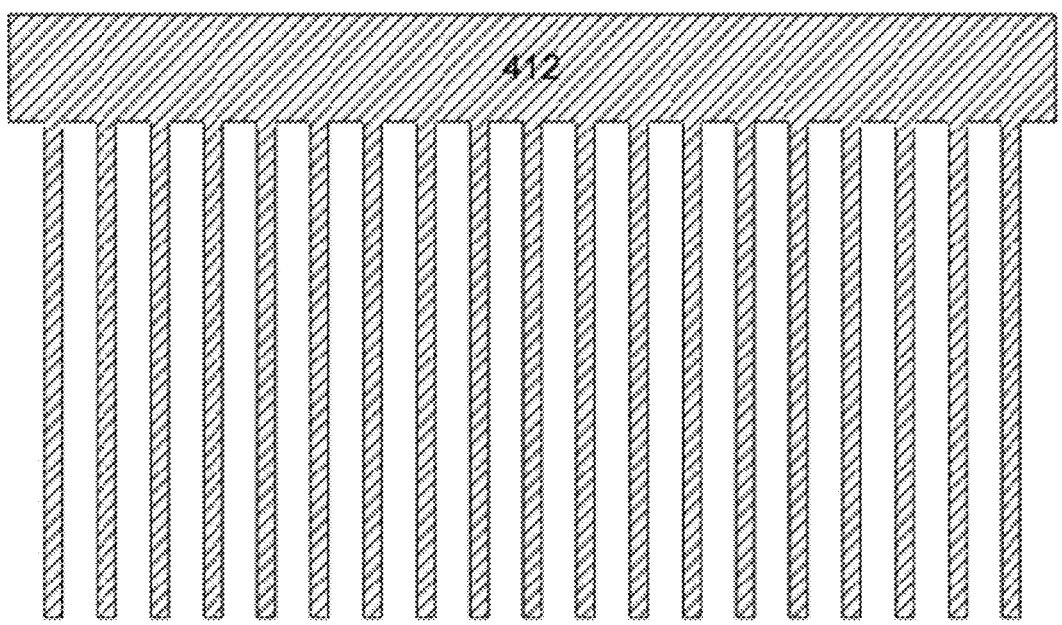
Figure 9C:
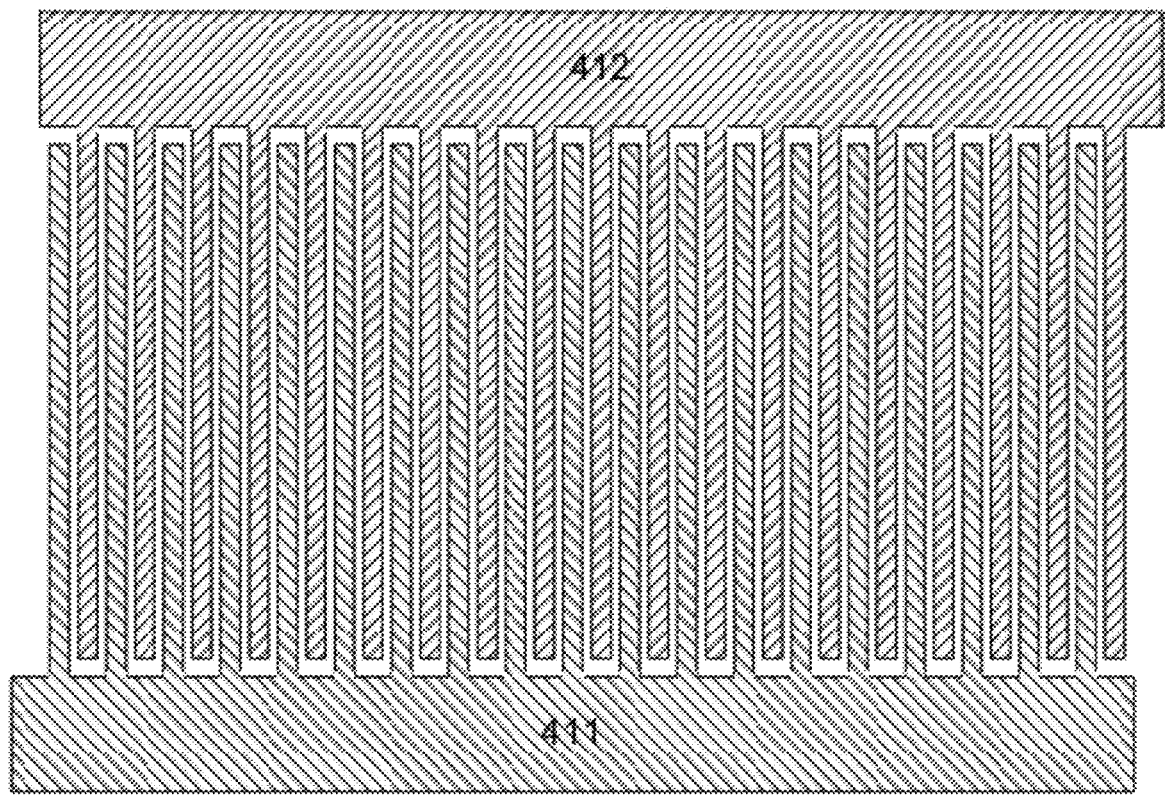

For example, in one embodiment, the mask 300 of FIG. 3 is used to create an implant region. In one embodiment, the open-ended slots 405a, 405b are machined to be narrower than the strips 404a and 404b. In this embodiment, the first panel 401 is used as a mask during an implant process. The resulting implant region 411 is shown in FIG. 9a. Those regions of the substrate which were covered by panel 401 are not implanted, while the remainder of the substrate (represented by implant region 411) is implanted during this implant process step. In a subsequent processing step, panel 402 is used as a mask. The resulting implant region 412 is shown in FIG. 9b. By offsetting the panels 401, 402 during the implant process, two interdigitated implant regions 411, 412 can be formed. The two implant regions 411, 412 are shown together in FIG. 9c. Such a pattern may be used to form interdigitated back contacts (IBC) for a solar cell.

The mask 100 may be located in close proximity to the substrate 138 or be located farther upstream from the substrate 138. The mask 100 may move or may be stationary with respect to the substrate 138 as the substrate 138 moves. The thickness of the mask 100 may control the dispersion of the ions 101 that pass through the opening 102. For example, the ions 101 may be collimated. The opening 102 in the mask may be formed in a line shape with a small pitch in one particular embodiment.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of creating an interdigitated implant region in a substrate, comprising:

using a first mask, wherein said first mask comprises a first member and a first plurality of strips extending from said first member so as to form a first comb shaped structure, wherein said first plurality of strips define a first plurality of open-ended slots through which ions may pass;

placing said first mask between an ion source and said substrate;

implanting ions into said substrate, wherein said ions are not implanted in a region covered by said first mask, thereby creating a first comb shaped implant region having a first implanted area and a first plurality of implanted strips extending therefrom, said first plurality of implanted strips corresponding to said first plurality of open-ended slots in said first mask;

using a second mask, wherein said second mask comprises a second member and a second plurality of strips extending from said second member so as to form a second comb shaped structure, wherein said second plurality of strips define a second plurality of open-ended slots through which ions may pass;

placing said second mask between said ion source and said substrate, wherein said second mask is oriented such that said second plurality of strips of said second mask cover said first plurality of implanted strips in said first comb shaped implant region and said first implanted area of said first comb shaped implant region is covered by said second member of said second mask; and implanting ions into said substrate, wherein said ions are not implanted in a region covered by said second mask, thereby creating a second comb shaped implant region, having a second implanted area and a second plurality of implanted strips extending therefrom.

2. The method of claim 1, wherein said first mask and said second mask are disposed a distance from said substrate.

3. The method of claim 1, wherein said first mask and said second mask are composed of a material selected from the group consisting of graphite, carbon, silicon, and quartz.

4. The method of claim 1, wherein said first comb shaped implant region and said second comb shaped implant region define a gap in between said first comb shaped implant region and said second comb shaped implant region.

* * * * *